United States Patent
Li et al.

(10) Patent No.: US 11,892,520 B2
(45) Date of Patent: Feb. 6, 2024

(54) METHOD AND DEVICE FOR POWER SUPPLY MAPPING DETECTION, ELECTRONIC DEVICE, AND MEDIUM

(71) Applicant: CHANGXIN MEMORY TECHNOLOGIES, INC., Hefei (CN)

(72) Inventors: Yu Li, Hefei (CN); Changqing Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 30 days.

(21) Appl. No.: 17/809,361

(22) Filed: Jun. 28, 2022

(65) Prior Publication Data
US 2023/0305075 A1    Sep. 28, 2023

Related U.S. Application Data

(63) Continuation of application No. PCT/CN2022/087598, filed on Apr. 19, 2022.

(30) Foreign Application Priority Data

Mar. 28, 2022 (CN) .......................... 202210312172.7

(51) Int. Cl.
    *G01R 31/40*   (2020.01)
    *G01R 19/165*  (2006.01)

(52) U.S. Cl.
    CPC ......... *G01R 31/40* (2013.01); *G01R 19/1659* (2013.01)

(58) Field of Classification Search
    CPC .......................... G01R 31/40; G01R 19/1659
    USPC ...................... 324/323, 522, 76.11
    See application file for complete search history.

(56) References Cited

U.S. PATENT DOCUMENTS

| | | | |
|---|---|---|---|
| 9,316,700 B2* | 4/2016 | Aeschlimann | G08B 21/182 |
| 9,618,585 B2* | 4/2017 | Hu | H02M 3/157 |
| 10,823,787 B2* | 11/2020 | Schat | G01R 31/40 |
| 11,609,277 B2* | 3/2023 | Xue | G06F 1/305 |
| 2014/0143559 A1 | 5/2014 | Gefen | |
| 2016/0064921 A1 | 3/2016 | Chaung et al. | |
| 2016/0225436 A1 | 8/2016 | Wang et al. | |
| 2018/0196110 A1* | 7/2018 | Chen | G01R 31/40 |
| 2019/0259463 A1 | 8/2019 | Jean et al. | |

(Continued)

FOREIGN PATENT DOCUMENTS

| CN | 201607480 U | 10/2010 |
|---|---|---|
| CN | 105528477 A | 4/2016 |

(Continued)

OTHER PUBLICATIONS

First Office Action of the Taiwanese application No. 111125759, dated Apr. 27, 2023. 7 pages with English translation.

*Primary Examiner* — Giovanni Astacio-Oquendo
(74) *Attorney, Agent, or Firm* — Syncoda LLC; Feng Ma

(57) ABSTRACT

A method and device for power supply mapping detection, and medium include the following operations. A voltage value of a power supply signal is obtained according to the power supply signal currently received by a function module; it is detected whether the voltage value of the power supply signal matches a standard voltage value corresponding to the function module; and responsive to the voltage value of the power supply signal not matching the standard voltage value corresponding to the function module, it is determined that a connection error occurs in a power supply connection of the function module.

20 Claims, 4 Drawing Sheets

(56) References Cited

U.S. PATENT DOCUMENTS

2019/0265290 A1    8/2019  Bohler et al.
2023/0221364 A1*   7/2023  Nam .................. G01R 31/2843
                                                       324/750.3

FOREIGN PATENT DOCUMENTS

| CN | 106771525 A  | 5/2017  |
|----|--------------|---------|
| CN | 106950489 A  | 7/2017  |
| CN | 109445342 A  | 3/2019  |
| CN | 113567894 A  | 10/2021 |
| CN | 113740749 A  | 12/2021 |
| TW | 382670 B     | 2/2000  |
| TW | 200732890 A  | 9/2007  |
| WO | 2018024464 A1| 2/2018  |

* cited by examiner

METHOD AND DEVICE FOR POWER SUPPLY MAPPING DETECTION, ELECTRONIC DEVICE, AND MEDIUM

CROSS-REFERENCE TO RELATED APPLICATIONS

This application is a continuation of International Patent Application No. PCT/CN2022/087598, filed on Apr. 19, 2022, which claims priority to Chinese Patent Application No. 202210312172.7, filed on Mar. 28, 2022. The disclosures of these applications are hereby incorporated by reference in their entirety.

BACKGROUND

With the development of memory technology, the memory is widely used in various fields. For example, the Dynamic Random Access Memory (DRAM) is widely used.

SUMMARY

The present disclosure relates to, but is not limited to, a method and device for power mapping, and medium.

According to some embodiments, a first aspect of the present disclosure provides a method for power supply mapping detection. The method includes: obtaining a voltage value of a power supply signal according to the power supply signal currently received by a function module; detecting whether the voltage value of the power supply signal matches a standard voltage value corresponding to the function module; and responsive to the voltage value of the power supply signal not matching the standard voltage value corresponding to the function module, determining that a connection error occurs in a power supply connection of the function module.

According to some embodiments, a second aspect of the present disclosure provides a device for power supply mapping detection. The device includes: a processor and a memory communicatively connected to the processor. The memory is configured to store computer-executable instructions; and the processor is configured to execute the computer-executable instructions stored in the memory to: obtain a voltage value of a power supply signal according to the power supply signal currently received by a function module; detect whether the voltage value of the power supply signal matches a standard voltage value corresponding to the function module; and responsive to the voltage value of the power supply signal not matching the standard voltage value corresponding to the function module, determine that a connection error occurs in a power supply connection of the function module.

According to some embodiments, a fourth aspect of the present disclosure provides a computer-readable storage medium having stored thereon computer-executable instructions that when executed by a processor, implement a method for power supply mapping detection. The method includes: obtaining a voltage value of a power supply signal according to the power supply signal currently received by a function module; detecting whether the voltage value of the power supply signal matches a standard voltage value corresponding to the function module; and responsive to the voltage value of the power supply signal not matching the standard voltage value corresponding to the function module, determining that a connection error occurs in a power supply connection of the function module.

BRIEF DESCRIPTION OF THE DRAWINGS

The accompanying drawings are incorporated in the description and constitute a part of the description, illustrate embodiments conforming to the disclosure, and are used together with the description to explain the principle of the disclosure.

Figure 1:
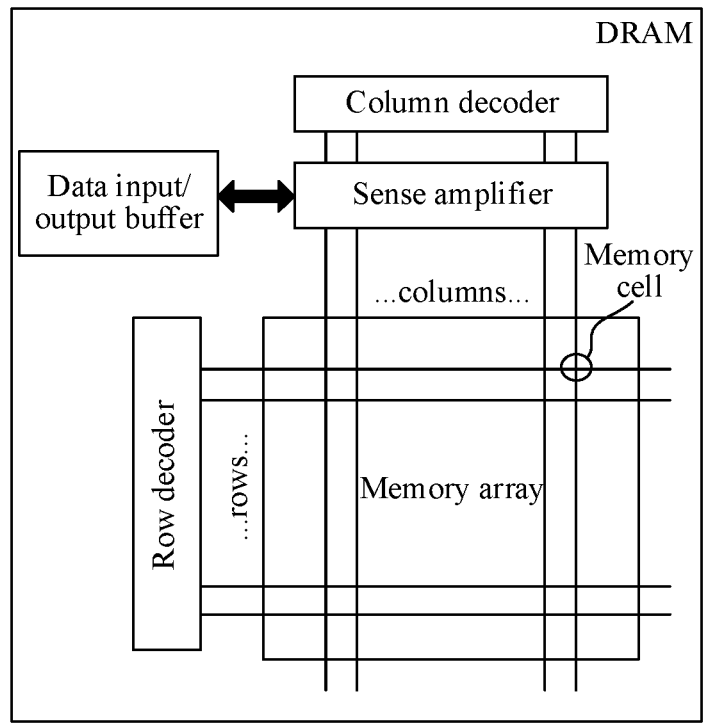
FIG. 1 is an exemplary architecture diagram of a memory according to an embodiment of the present disclosure.

Specific embodiments of the present disclosure have been illustrated through the above accompanying drawings and will be described in more detail hereinafter. These drawings and textual descriptions are not intended to limit the scope of the inventions of the present disclosure in any way, but to illustrate the concepts of the present disclosure by reference to specific embodiments for those skilled in the art.

DETAILED DESCRIPTION

Exemplary embodiments, examples of which are illustrated in the drawings, will be described in detail herein. When the following description relates to the drawings, unless otherwise indicated, the same numerals in different drawings denote the same or similar elements. The embodiments described in the following exemplary embodiments do not represent all embodiments consistent with the present disclosure. In contrast, they are only examples of the device and method as described in the claims and consistent with some aspects of the present disclosure.

The terms "comprise" and "contain" in the present disclosure indicate open inclusion, and indicate that there may be additional elements/components/etc. in addition to the listed elements/components/etc. The terms "first", "second", etc. are only used as markers and are not intended to limit the quantity of the object thereof. Furthermore, different elements and regions in the drawings are only schematically illustrated, and therefore the present disclosure is not limited to the dimensions or distances illustrated in the drawings.

The technical solution of this disclosure will be described in detail with specific examples. The following specific embodiments may be combined with each other, and the same or similar concepts or processes may not be elaborated in some embodiments. Embodiments of the present disclosure will now be described in conjunction with the accompanying drawings.

To implement low power consumption, a power supply with multiple voltages may be designed and the multiple voltages may be provided to corresponding modules in the memory, respectively. That is, the power supplies for respective modules are refined to reduce the power consumption.

However, in some applications, if the module is wired to the power supply incorrectly, the low power consumption cannot be efficiently implemented.

FIG. 1 illustrates an exemplary architecture diagram of a memory according to an embodiment of the present disclosure. As illustrated in FIG. 1, taking the DRAM as an example, the DRAM includes a data input/output buffer, a row decoder, a column decoder, a sense amplifier, and a memory array. The memory array mainly includes rows and columns, the rows are also referred to as word lines, the columns are also referred to as bit lines, and the intersections of the word lines and the bit lines are the memory cells of the memory array.

Figure 2:
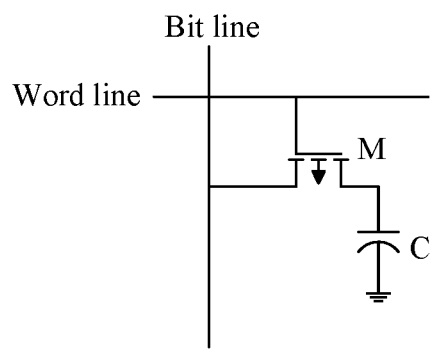
FIG. 2 is a structural diagram of a memory cell according to an embodiment of the present disclosure.

Each memory cell is used to store one bit of data. As illustrated in FIG. 2, FIG. 2 illustrates an exemplary structural diagram of a memory cell according to an embodiment of the present disclosure. The memory cell mainly includes a transistor switch M and a capacitor C. The capacitor is used to store bit data, and the transistor switch is used to turn off or turn on according to the selected state.

A certain memory cell may be activated by controlling rows and columns to implement access to the memory cell. Combined with the reading scenario as an example, when the bit data in the memory cell needs to be read, the row (word line) in which the memory cell is located can be selected through the row decoder. Accordingly, the transistor switch M in the figure is turned on, and the state on the capacitor C at this case can be sensed through the sense amplification for the column (bit line) signal. For example, if the bit data stored in the memory cell is 1, after the transistor switch M is turned on, 1 can be read from the bit line of the memory cell, and vice versa. Furthermore, combined with the writing scenario as an example, when the bit data needs to be written into a certain memory cell, for example, 1 is to be written, the row (word line) in which the memory cell is located can be selected by the row decoder. Accordingly, the transistor switch M in the figure is turned on, and the capacitor C is charged, that is, 1 is written into the memory cell, by setting the logic level of the column (bit line) to 1. On the contrary, if 0 is to be written, the logic level of the bit line is set to 0, so that the capacitor C is discharged, that is, 0 is written to the memory cell.

Based on the above examples, the memory may be considered as a device including multiple function modules (such as a data input/output buffer, a row decoder, a column decoder, a sense amplifier, etc.). Multiple function modules cooperate with each other to implement the functions of the memory, such as writing and reading of data.

In view of the power consumption problems, a refined power supply is employed in some methods. That is, for some function modules, a certain voltage value may be designed as the power supply voltage for these function modules, and for other function modules, different power supply voltage values may be involved. Taking a Double Date Rate Synchronous Dynamic Random Access Memory (abbreviated as DDR), the DDR includes three sets of power supply voltages, for example, VDD1/VDD2/VDDQ, where VDD2 includes VDD2H and VDD2L. Specifically, the voltage values of different power supply signals may be the same or different, for example, VDD1 is approximately 1.8 volts (V), VDD2 is about 1.2V, and VDDQ is about 1.2V. VDD1 and VDD2 belong to the power supply corresponding to the core region (memory array) and VDDQ belongs to the power supply corresponding to the input/output buffer. That is, in a refined power supply method, a respective power supply voltage value (also referred to as a standard voltage value herein) is designed for each function module to reduce power consumption.

However, the present method finds that, in the refined power supply method, if there is an error in the power supply connection of the function module, the effect of low power consumption may not be effectively implemented. For this case, in some techniques, the connections are detected manually one by one for errors, however, such manner consumes a lot of labors and effort and often may not implement accurately and comprehensively check. In some other methods, whether the expected low power consumption effect is met is evaluated by detecting the operating current. For example, in these methods, the operation currents under certain operations (such as an operating burst write current, all bank refresh burst current, a power down self refresh current, etc.) are measured, and the power consumption for the operation is further calculated. However, this method tends to examine problems in the manufacturing process and fails to effectively troubleshoot the connection relationship (since the present disclosure mainly focuses on the connection between the function modules and the power supply, also referred to as power mapping).

Some aspects of embodiments of the present disclosure relate to the above considerations. The solution is described below by way of example in conjunction with some embodiments of the present disclosure.

First Embodiment

Figure 3:
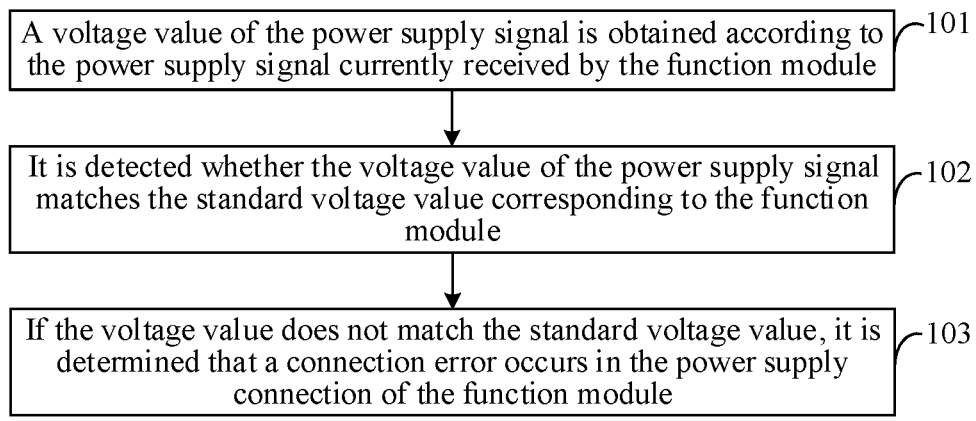
FIG. 3 is a schematic flowchart of a method for power supply mapping detection provided by an embodiment.

FIG. 3 is a flowchart of a method for power supply mapping detection provided by an embodiment. As illustrated in FIG. 3, the method includes the operations 101 to 103.

At operation 101, a voltage value of the power supply signal is obtained according to the power supply signal currently received by the function module.

At operation 102, it is detected whether the voltage value of the power supply signal matches the standard voltage value corresponding to the function module.

At operation 103, responsive to the voltage value of the power supply signal not matching the standard voltage value corresponding to the function module, it is determined that a connection error occurs in the power supply connection of the function module.

In practical application, the method for power supply mapping detection provided by the present embodiment may be applied to various memories. For example, the method for power supply mapping detection may be applied to, but not limited to, a DDR. Furthermore, the method is implemented in a variety of manners. For example, the method may be implemented by a computer program, such as a software module, application software, or plug-in, etc. Alternatively, the method may be implemented as a medium having stored thereon a related computer program, for example, a USB disk, a cloud disk, or the like. Alternatively, the method may also be implemented by an entity device that integrated or installed with a related computer program, such as a chip or the like. In an example, a respective software module may be provided for each function module, and the software module is used for detecting whether the power supply connection of the function module in which the software module is located is correct.

The function module is a module in the memory for performing some kind of processing. For example, the processing herein includes any processing in the operating processes of the memory, for example, the processing includes, but not limited to, logical operation, reading/writing, sense amplification, etc. The function module in the example may be determined based on the requirement for a power mapping check. For example, when the power connection relationship of the sense amplifier needs to be detected, the sense amplifier may be used as the function module in the present example, and the power supply mapping detection is performed by the method provided in the embodiment.

For example, the power mapping of the memory may be fully detected, and since the number of function modules in the memory may be large, an execution strategy for the power supply mapping detection may be developed to avoid missed detection. In an example, the detection may be performed according to the functional level of each function module. For example, the upper functional levels are relatively macroscopic, for example, the function modules such as data input/output buffer, row decoder, column decoder, sense amplifier are used to implement processing of data buffer, row address decoding, column address decoding, and sense amplification, respectively. The lower functional levels are more specific, for example, the data input/output buffer module may include a operation-up/step-down module, an inverter module, etc., which are used for performing corresponding operation-up/step-down and inversion processing. Accordingly, operations 101 to 103 may be performed for each function module at each functional level until the power supply mapping detection is performed for all function modules. In another example, all function modules connected to the power supply signal may be counted according to the design circuit. For example, in the circuit design, the function module needed power supply is designed with a power supply port to be connected to the power supply signal. For example, for an inverter, the source of an upper PMOS transistor is usually used as the power supply port of the inverter, and is connected to the power supply signal. Therefore, it is also possible to count all the ports connected to the power supply signal according to the design circuit, the corresponding function modules may be determined based on the statistics of these ports, and operations 101 to 103 may be performed for each function module until the power supply mapping detection is performed for all the function modules.

In an example, the voltage value of the power supply signal may be represented as binary bit data, and the voltage value of the power supply signal may be accurately represented by the binary bit data. For example, the binary bit data may include first data, second data, and third data. The first data indicates a current power supply state, the second data indicates the voltage value of the power supply signal has a positive sign or a negative sign, and the third data indicates a voltage absolute value of the power supply signal. In the present example, the binary bit data is used to represent the voltage value of the power supply signal, such that more information, such as the power supply status, the voltage value being positive or negative, the absolute value of the voltage value, etc., can be carried to check whether the power connection of each function module is correct, thereby assisting the designer to find the power connection error. For example, the voltage value of the power supply signal is represented by using a 32-bits binary data. Specifically:

[0] bit indicates the current state, such as powered/unpowered (for example, 1 indicates powered and 0 indicates unpowered);

[1] bit is flag bit and indicates whether the voltage value is positive or negative; and other bits [31:2] indicate the absolute value of the voltage value.

In practical application, based on different types of voltage value representation, a more convenient manner can be considered to perform voltage value matching. As a manner, on the basis of the above example, the standard voltage value can also be represented as binary bit data. Accordingly, operation 102 may specifically include the following operations.

It is detected whether each bit data of the voltage value of the power supply signal is consistent with the respective bit data of the standard voltage value.

Responsive to that each bit data of the voltage value of the power supply signal is consistent with the respective bit data of the standard voltage value, it is determined that a voltage value of the power supply signal matches the standard voltage value corresponding to the function module; and otherwise, it is determined that the voltage value of the power supply signal does not match the standard voltage value corresponding to the function module.

Specifically, based on the voltage value of the power supply signal and the standard voltage value which are represented by the binary bit data, the matching for the voltage values may be implemented by comparing the respective values at each corresponding bit. For example, assuming that the voltage value of the power supply is 2V, the binary bit data is 0010; and assuming that the standard voltage value is also 2V, the binary bit data is 0010. Accordingly, when the matching for the voltage values is performed, the matching may be performed bit by bit from the high bit to the low bit. For example, in the above example, for the voltage value of the power supply signal, the highest bit is 0, the second highest bit is 0, the third highest bit is 1, and the lowest bit is 0. For the standard voltage value, the highest bit of is 0, the second highest bit is 0, the third highest bit is 1, and the lowest bit is 0. During matching, the matching can be performed for the highest bit first, and it can be seen that the highest bit of the voltage value of the power supply signal is 0, and the highest bit of the standard voltage value is also 0, so the highest bits are the same. Next, the matching is performed for the second highest bit, and it can be seen that the highest bit of the voltage value of the power supply signal is 0, and the highest bit of the standard voltage value is also 0, so that the second highest bits are the same. Similarly, the values of the third highest bits are all 1, and therefore are the same; until the values of the lowest bits are also the same value of 0. It can be seen that in the example, the voltage value of the power supply signal is the same as the standard voltage value, and therefore the voltage value of the power supply signal matches the standard voltage value.

It is to be noted that the above example is only an example, and does not exclude other possible implementations. For example, the order of matching may also be performed bit by bit from the low bit to the high bit, or performed bit by bit in other orders.

Furthermore, in the above example, the voltage value of the power supply signal is the same as the standard voltage value, but it is to be understood that in view of the fluctuation and fault tolerance of the signal in the actual application, when there is a slight allowable error between the voltage value of the power supply signal and the standard voltage value, it is also determined that the voltage value of the power supply signal matches the standard voltage value.

In an example, when the voltage value is represented by using binary bit data, the lower the bit, the smaller the error between the two voltage values if the values are unequal.

Therefore, in order to further simplify the matching method, the matching may be only performed for the values of the first predetermined number of bits of the two voltage values, and not performed for the values of the remaining lower bits, so that the power supply mapping detection is performed within the allowable error redundancy range, and the detection efficiency is improved. The predetermined number herein may be set according to the allowable error.

In practical application, the standard voltage value information corresponding to each function module can be established and maintained, such that when the power supply mapping detection is performed, the standard voltage value may be obtained conveniently and accurately to match with the actual power supply voltage value. In an example, the standard voltage value includes an operating voltage value domain. Accordingly, operation 102 may specifically include the following operations.

It is detected whether the voltage value of the power supply signal is within an operating voltage value domain of the function module.

Responsive to the voltage value of the power supply signal being within the operating voltage value domain, it is determined that the voltage value of the power supply signal matches the standard voltage value corresponding to the function module; and responsive to the voltage value of the power supply signal being not within the operating voltage value domain, it is determined that the voltage value of the power supply signal does not match the standard voltage value corresponding to the function module.

The operating voltage range may be determined according to the operating voltage of the function module. In an example, the operating voltage domain includes at least one of: a Voltage of Wordline Programming (Vwlp) value domain, a Voltage of Column Select Line Pump (Vcslp) value domain, and a Voltage of Isolate gate in Noise Cancelation Sense Amplifier (voltage of isolate gate in NCSA, Viso) value domain. Specifically, each operating voltage has a corresponding value domain range, and the value domain ranges of different voltages may be different.

In conjunction with the scenario as an example, the standard voltage value of the function module includes an operating voltage value domain. When it is necessary to detect whether the power connection of a certain software module is correct or not, the actual power supply voltage value (the voltage value of the power supply signal) is first parsed according to the power supply signal actually received by the software module, and then it is detected whether the actual power supply voltage value falls within the operating voltage value domain of the software module. For example, if the actual power supply voltage value is 1.25V and the operating voltage value domain is 1.2~1.3V, it is considered that the power supply voltage value falls within the operating voltage value domain. Accordingly, if the power supply voltage value falls within the corresponding operating voltage value domain, it is considered that the voltage value of the power supply signal matches the corresponding standard voltage value; otherwise, it is considered that the voltage value of the power supply signal does not match the corresponding standard voltage value.

In the above example, by way of the value domain, the matching result is determined by detecting whether the actual power supply voltage value falls within the operating voltage value domain, such that the voltage fluctuation and error of the circuit in the actual operating scenario can be taken into consideration, thereby improving the accuracy and reliability of the power supply mapping detection.

According to the above example, the difference between different power supplies can be distinguished based on the voltage value of the power supply signal, and the power supply traceability of the function module may be implemented by matching for the voltage values, so that the positioning error correction of the power supply mapping is facilitated, automatic detection is implemented, and the verification efficiency is improved. Specifically, in conjunction with the foregoing examples, if it is detected that the voltage value of the power supply signal currently received by the function module does not match the standard voltage value corresponding to the function module, it is considered that a connection error occurs in the power supply connection of the function module, i.e., a power supply mapping error. Subsequently, the power connection relationship can be detected for the function module for error correction. In another case where the two voltage values match, it may be preliminarily considered that the current power supply connection of the function module does not have a negative effect on the low power consumption of the function module.

Figure 4:
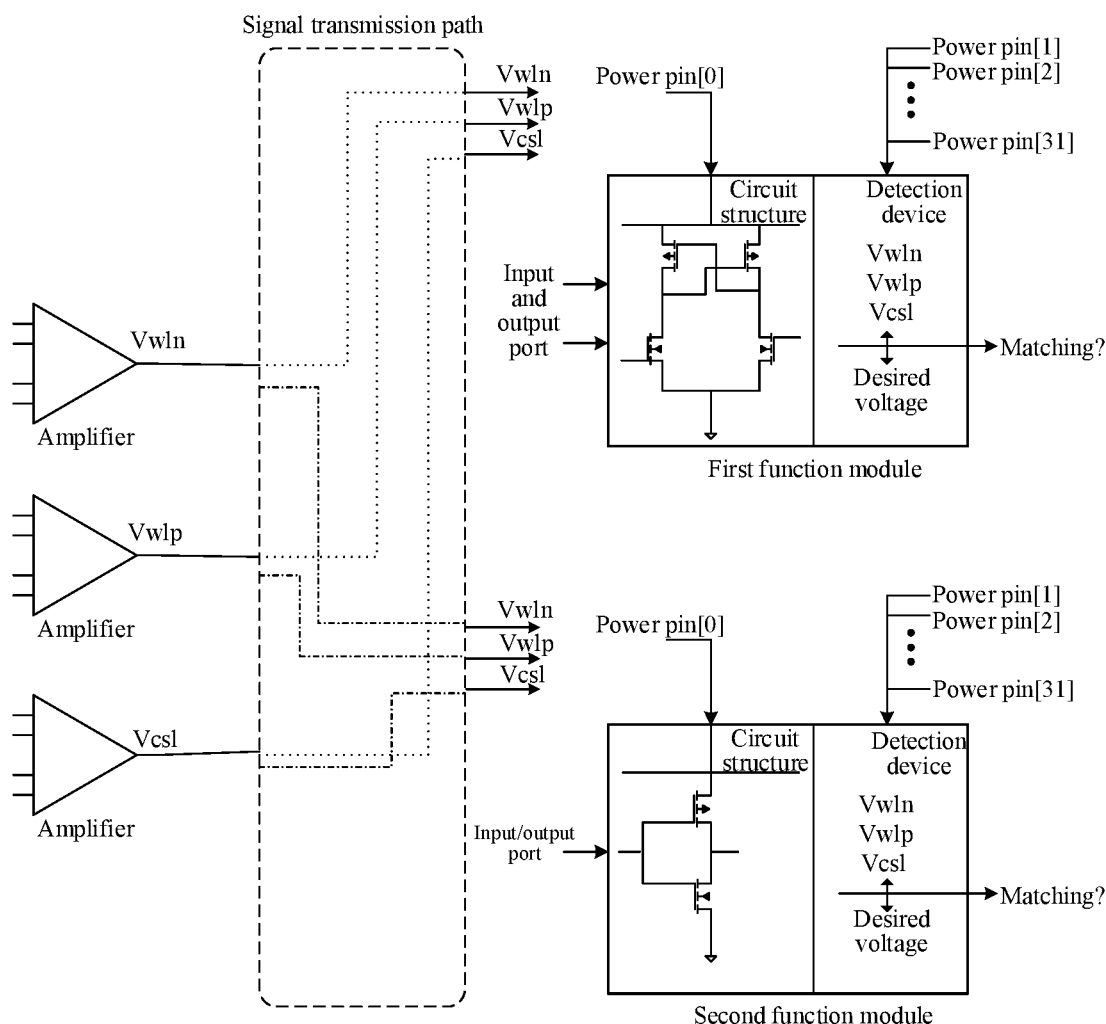
FIG. 4 is an exemplary architecture diagram of an exemplary refined power supply method.

For a better understanding of the method, the refined power supply method is exemplified for the actual scenario in conjunction with FIG. 4. FIG. 4 is an exemplary architecture diagram of an exemplary refined power supply method. As illustrated in FIG. 4, the power supply signal with a plurality of voltage values is provided, such as a voltage of word line (Vwln), a Vwlp, and a voltage of column selection line (Vcsl) in the figure. The voltage values of different power supply signals in the figure may be the same or different, and the number and values of the plurality of voltage values may be set according to the requirements for the refined power supply. In practical applications, the power supply signal may be output by an amplifier having a certain amplification gain, i.e., as illustrated in FIG. 4, each power supply signal is output by an amplifier. Based on the refined power supply method, these power supply signals will be provided to the respective function modules through the signal transmission path. Furthermore, two function modules, i.e., the first function module and the second function module, are exemplified in the figure, however, it is to be understood that this is only an example, and the function modules in the embodiment is not limited to the case illustrated in the figure.

Specifically, according to the method of the present embodiment, it is not necessary to spend a lot of time to sort out the signal transmission path between the power supply signal and the function module. Especially in the case of a highly integrated device such as a memory, it will take a lot of time and effort to sort out the connection between the power supply and the function module by checking the signal transmission path. Based on the method of the present embodiment, it is not necessary to consider the signal transmission path, and it is determined whether the function module is correctly connected to the designed power supply signal by matching the voltage value of the power supply actually received by the function module with the designed standard voltage value. In conjunction with the example of FIG. 4, a power supply mapping detection device (including, but not limited to, an implementation form of a computer program) may be provided in each function module, for example, the function module in the figure includes a circuit structure, and the figure illustrates that the function module includes an input/output port, and the function module is provided with a power supply mapping detection device.

The voltage value of the power supply signal is parsed by the power supply mapping detection device based on the power supply signal currently received by the function module. In an example, a multi-bits binary number may be generated according to the power supply signal, and the multi-bits binary number may indicate the current power supply state, that the power supply voltage value is positive or negative, and the absolute value of the power supply voltage value. Referring to FIG. 4, for example, the power supply mapping detection device generates a 32 bits of binary number, i.e., Power pin[31:0], according to the power supply signal. Power pin[0] indicates that the function module currently receives the power supply signal, and Power pin[31:1] denotes the voltage value of the power supply signal. Subsequently, the matching is performed based on the voltage value of the power supply signal and the standard voltage value corresponding to the function module. For example, for the first function module or the second function module, the matching is performed on the actual received Vwln voltage value with the standard Vwln voltage value, and similarly, the matching is performed between the actual power supply voltage value of the Vwlp and the standard voltage value of the Vwlp, and between the actual power supply voltage value of the Vcsl and the standard voltage value of the Vcsl, respectively (all standard voltage values are collectively illustrated as a desired power supply in the figure), so as to detect the Vwln power mapping, the Vwlp power mapping, and the Vcsl power mapping of the function module. Whether an error has occurred or not in the power mapping of the function module may be detected through performing matching.

In order to improve the reliability of the power supply mapping detection, it is further considered the possibility that the voltage values of some power supply signals are the same. For example, different amplifiers in FIG. 4 may output the power supply signals with the same voltage value, such that although a successful voltage value matching result occurs, the actual connection may be incorrect. For this case, a further detection method is provided in some embodiments.

Figure 5:
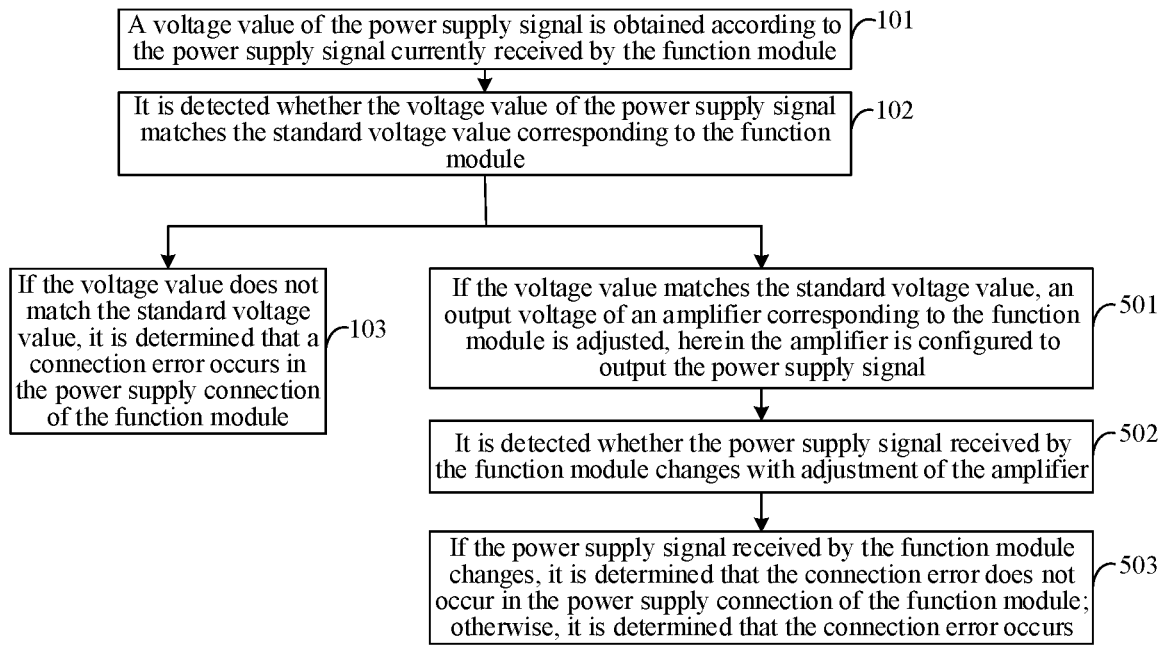
FIG. 5 is a schematic flowchart of a method for power mapping provided by an embodiment.

FIG. 5 is a flow diagram of a method for power supply mapping detection according to an embodiment. As illustrated in FIG. 5, on the basis of any one of the foregoing examples, after operation 102, the method further includes operations 501 to 503.

At operation 501, responsive to the voltage value of the power supply signal matching the standard voltage value corresponding to the function module, an output voltage of an amplifier corresponding to the function module is adjusted, herein the amplifier is configured to output the power supply signal.

At operation 502, it is detected whether the power supply signal received by the function module changes with adjustment of the amplifier.

At operation 503, responsive to the power supply signal received by the function module changing, it is determined that the connection error does not occur in the power supply connection of the function module; and responsive to the power supply signal received by the function module not changing, it is determined that the connection error occurs in the power supply connection of the function module.

With reference to an example of the actual scenario, for a function module that the matching between the power supply voltage value and the standard voltage value is successful, it is further determined whether the power supply connection of the function module is correct by adjusting the power supply signal corresponding to the function module. "Corresponding" herein indicates the power supply signal originally designed for the function module, i.e., the power supply signal desired to be connected. With reference to the above-mentioned example of the scenario, the power supply signal is usually output by the amplifier. Therefore, in the present embodiment, the power supply signal corresponding to the function module is adjusted by adjusting the output voltage of the amplifier corresponding to the function module. The term "amplifier corresponding to the function module" used herein also refers to the amplifier desired to be connected. It is to be understood that, during the adjustment of the amplifier, if the power supply signal actually received by the function module changes with the adjustment, it indicates that the function module is correctly connected to the amplifier desired to be connected, otherwise it indicates that the function module may not be connected to the desired power supply signal, but the voltage value of the actually connected power supply signal is just the same as the desired standard voltage value, and subsequently, error correction can be performed for the power connection of this function module.

In the present embodiment, the manners for adjusting the output voltage of the amplifier is not limited as long as the power supply signal of the function module can be changed under the assumption that the power connection is correct. For example, adjusting the output voltage of the amplifier corresponding to the function module in operation 501 may specifically include: changing the gain coefficient of the amplifier currently corresponding to the function module. That is, in the present example, the output voltage of the amplifier corresponding to the function module is changed by changing the gain of the amplifier to further confirm whether the power supply connection of the function module with a successful voltage value matching is correct or not. For example, assuming that the standard voltage value corresponding to the function module is 1.2V, and the power supply voltage value obtained according to the currently received power supply signal is also 1.2V, the gain of the amplifier corresponding to the function module may be adjusted, for example, the gain is increased, and after the adjustment, it is further detected whether the voltage value of the power supply signal currently received by the function module is increased with the increasing gain, and if the received power supply voltage value is increased with the increasing gain, it is verified that the power supply connection of the function module is correct.

In another example, adjusting the output voltage of the amplifier corresponding to the function module in operation 501 may specifically include: selecting another amplifier as the amplifier currently corresponding to the function module; herein the gain coefficient of the another amplifier is different from the gain coefficient of the amplifier previously corresponding to the function module. That is, in the present example, the voltage value of the power supply signal that the function module should theoretically receive is changed by changing the amplifier to which the function module is connected, so as to determine whether the power supply connection of the function module is correct by detecting whether the power supply signal actually received by the function module changes accordingly. For example, assuming that the standard voltage value corresponding to the function module is 1.2V, and the power supply voltage value obtained according to the currently received power supply signal is also 1.2V, the function module may be switched to connect to another amplifier with different gain, such as an amplifier with a larger gain, and after the switching, it is further detected whether the voltage value of the power supply signal currently received by the function module is increased with the switching of the amplifier. If the received power supply voltage value increases, it is verified that the power supply connection of the function module is correct.

The change with the adjustment of the amplifier indicates that, based on the assumption that the power connection is correct, the adjustment of the amplifier should reflect to the corresponding change in the power supply signal received by the function module. In an example, operation 502 may specifically include following operation.

Responsive to detecting that the power supply signal received by the function module meets at least one of following conditions, it is determined that the power supply signal received by the function module changes with the adjustment of the amplifier. The condition includes: a change in the power supply signal is positively correlated with the adjustment of the amplifier, or the change in the power supply signal lasts for a preset duration.

In conjunction with a scenario example, during the adjustment of the amplifier, if the change in the power supply signal actually received by the function module is positively correlated with the adjustment of the amplifier, it indicates that the power supply signal changes with the adjustment of the amplifier. Positive correlation used herein indicates that if the output voltage of the amplifier becomes larger, the power supply signal becomes larger, and if the output voltage of the amplifier becomes smaller, the power supply signal becomes smaller. By this means, it is detected whether or not the amplification is followed to accurately determine whether or not the power supply connection of the function module is correct. Furthermore, in order to make the power supply mapping detection more convenient, it is also possible to observe whether or not the power supply signal changes during the adjustment of the amplifier, and if the change in the power supply signal lasts for a certain period of time, it indicates that the power supply signal is affected by the adjustment of the amplifier, that is, it is proved that the power connection is correct. The duration may be determined according to the duration of the adjustment of the amplifier. Even the signal interference is taken into consideration, for example, a change in the voltage of an adjacent power supply line may cause a change in the voltage of the present power supply line, such interference is generally temporary or transient, and therefore, based on the present example, it is possible to detect the change followed in a more convenient manner.

Furthermore, in some embodiments, further consideration is given to refined power supply scenarios in different operating modes, such as a time-sharing power supply mode or a superimposed power supply mode, and a more targeted power supply mapping detection method is provided. The power supply mapping detection for different power supply modes will be described with reference to the following embodiments.

Figure 6:
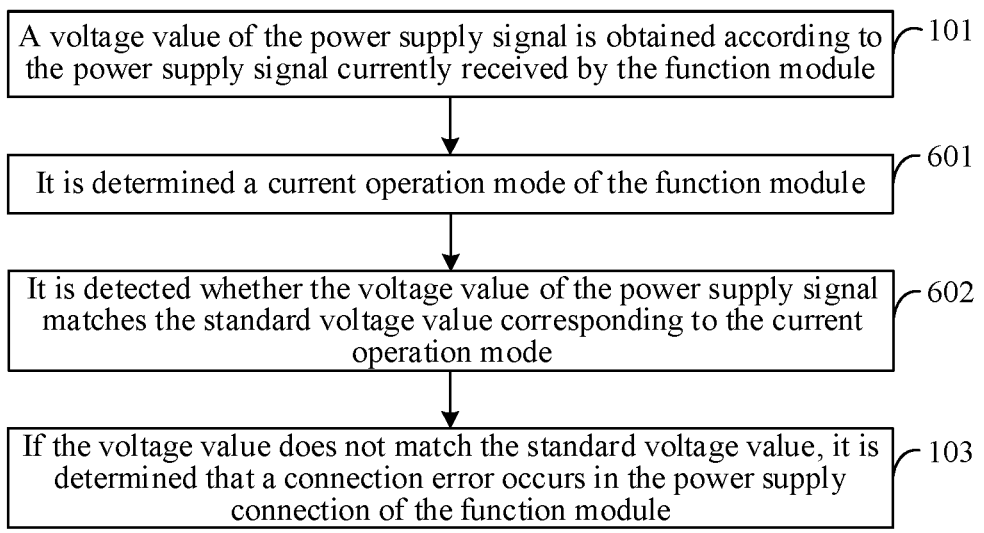
FIG. 6 is a schematic flowchart of a method for power mapping provided by an embodiment.

Considering different power supply modes, the power supply mapping detection is performed in combination with the operating mode of the function module. Therefore, in some embodiments, the standard voltage value corresponds to the operating mode of the function module. Accordingly, as illustrated in FIG. 6, FIG. 6 is a flow diagram of a power supply mapping detection method provided by an embodiment. On the basis of any one of the foregoing examples, operation 102 may specifically include operations 601 and 602.

At operation 601, it is determined a current operation mode of the function module.

At operation 602, it is detected whether the voltage value of the power supply signal matches the standard voltage value corresponding to the current operation mode.

If the operating modes of the function modules are different, the corresponding standard voltage values are different. For example, in the time-sharing power supply mode, different operating modes of the function module correspond to different standard voltage values, for example, the standard voltage value in the high frequency mode is larger, and the standard voltage value in the low frequency mode is smaller. For another example, in the superimposed power supply mode, the standard voltage value in the superimposed power supply mode may be preset. For example, assuming that a function module is powered by the superimposition of 1.8V and 2V in the superimposed power supply mode, the corresponding standard voltage value is about 1.9V. Therefore, the standard voltage value corresponding to the function module in the superimposed power supply mode may be set to 1.9V, or the standard voltage value domain is a voltage range including 1.9V but does not include 1.8V and 2V. The standard voltage value is subsequently used to perform matching with the voltage value actually received by the function module. Specifically, the standard voltage value used for matching is selected according to the operating mode of the function module.

In an example, the standard voltage value includes a standard voltage value corresponding to a high frequency mode and a standard voltage value corresponding to a low frequency mode. operation 601 may specifically include following operation.

It is determined whether the function module is in a time-sharing power supply mode; responsive to the function module being in the time-sharing power supply mode, it is determined whether the function module is in the high frequency mode or in the low frequency mode.

Accordingly, operation 602 may specifically include following operations.

When the function module is in the high frequency mode, it is detected whether the voltage value of the power supply signal matches the standard voltage value corresponding to the high frequency mode.

When the function module is in the low frequency mode, it is detected whether the voltage value of the power supply signal matches the standard voltage value corresponding to the low frequency mode; herein the standard voltage value corresponding to the high frequency mode is different from the standard voltage value corresponding to the low frequency mode.

Figure 7:
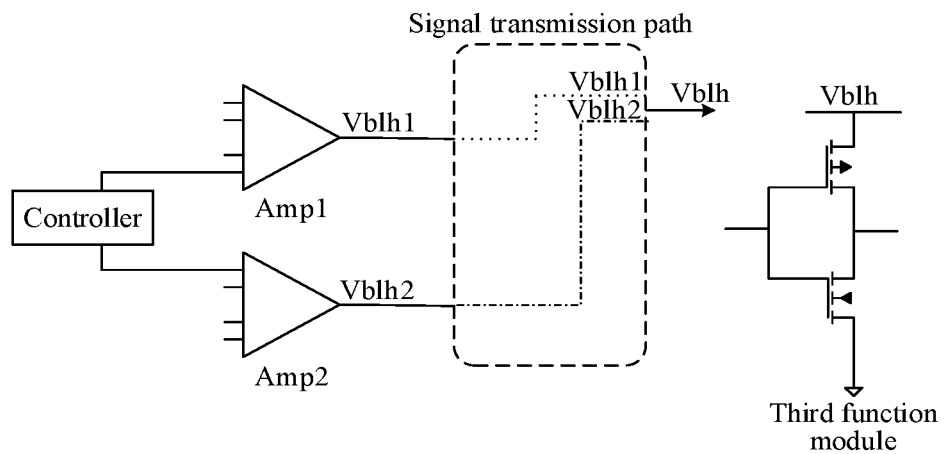
FIG. 7 is an exemplary schematic diagram of the architecture of a time-sharing power supply.

In conjunction with an actual scenario example, in actual application, there may be a function module for time-sharing power supply. Taken the architecture illustrated in FIG. 7 as an example, FIG. 7 is an exemplary schematic diagram of the architecture of a time-sharing power supply. In the figure, the power supply terminal of the third function module receives the power supply signal Vblh. Accordingly, on the left side of the figure, two amplifiers (Amp1 and Amp2) output two Vblh, labeled Vblh1 and Vblh2, respectively. The voltage values of Vblh1 and Vblh2 are different. The third function module is connected to Amp1 and Amp2 through a signal transmission path to receive one of the two power supply signals. Specifically, in the time-sharing power supply mode, the controller may select to enable one of the two Vblh according to the operating frequency of the current function module, and provide that Vblh to the function module. Specific providing manner includes, but not limited to, being implemented by controlling the switching elements on the respective signal transmission path, which is only exemplified herein, and specific manner may also referred to the related art. That is, in the time-sharing power supply mode, the standard voltage value is determined according to the operating frequency of the function module.

For the power supply mapping detection in the time-sharing power supply mode, in the present example, when the function module is in the time-sharing power supply mode, the corresponding standard voltage value is selected according to whether the function module is currently in the high frequency or in the low frequency mode. Then, the matching is performed between the selected standard voltage value and the voltage value of the power supply signal currently received by the function module.

In another example, the standard voltage value includes a standard voltage value corresponding to the superimposed power supply. operation 602 further includes following operation.

If the current operation mode is superimposed power supply, it is detected whether the voltage value of the power supply signal matches the standard voltage value corresponding to the superimposed power supply.

Also in conjunction with the actual scenario example, in practical application, there may be a function module for superimposed power supply. For example, still referring to the architecture illustrated in FIG. 7, in the superimposed power supply mode, the controller may simultaneously enable two Vblh and provide the two Vblh together to the function module. Similarly, the specific providing manner, includes, but not limited to, being implemented by controlling the simultaneous conduction of switching elements on the corresponding signal transmission path, which is only exemplified here, the specific manner may be referred to the related art. That is, in the superimposed power supply mode, a corresponding standard voltage value is set.

For the power supply mapping detection in the superimposed power supply mode, in the present example, when the function module is in the superimposed power supply mode, the standard voltage value corresponding to the function module in the superimposed power supply mode is selected. Then, the power mapping of the function module is detected by matching the selected standard voltage value with the voltage value of the power supply signal currently received by the function module.

It is to be noted that the above examples in the embodiment may be implemented individually or in combination. For example, in an example of a combined implementation, the standard voltage value in the binary bit data format may be selected based on the operating mode of the function module, and then the voltage value matching is performed between the power supply voltage value in the binary bit data format and the standard voltage value to implement accurate and convenient power supply mapping detection.

In the power supply mapping detection method provided in this embodiment, according to the power supply signal actually received by the function module, it is detected whether the power supply connection of the function module is correct by detecting whether the voltage value of the actually received power supply signal matches the standard voltage value designed for the function module. In the above method, by detecting whether the actual power supply voltage value matches the desired standard voltage value, the power supply connection of each function module may be detected, so as to check and correct the wrong connection timely, thereby ensuring reliable implementation of refined power supply and effectively reducing the power consumption.

Second Embodiment

Figure 8:
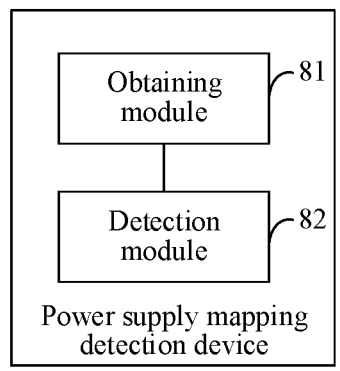
FIG. 8 is a schematic structural diagram of a device for power mapping provided by an embodiment.

FIG. 8 is a schematic structural diagram of a device for power supply mapping detection according to an embodiment. As illustrated in FIG. 8, the device includes an obtaining module 81 and a detection module 82.

The obtaining module 81 is configured to obtain a voltage value of the power supply signal according to the power supply signal currently received by the function module.

The detection module 82 is configured to detect whether a voltage value of the power supply signal matches a standard voltage value corresponding to the function module.

The detection module 82 is further configured to, responsive to the voltage value of the power supply signal not matching the standard voltage value corresponding to the function module, determine that a connection error occurs in the power supply connection of the function module.

In practical application, the device for power supply mapping detection provided by the present embodiment may be applied to various memories. For example, the device for power supply mapping detection may be applied to, but not limited to, a DDR including double rate, etc. Furthermore, the device may be implemented in a variety of ways. For example, the device may be implemented through a computer program, such as a software module, application software, or plug-in; Alternatively, the apparatus may be implemented as a medium storing a related computer program, for example, a USB disk, a cloud disk, or the like. Alternatively, the device may also be implemented through a physical device, such as a chip or the like, integrated with or installed with a related computer program. In an example, a corresponding software module may be provided for each function module, the software module is configured to detect whether the power supply connection of the function module in which the software module is located is correct.

The function module is a module in the memory for performing some kind of processing. For example, the processing herein includes any processing in the operating processes of the memory, for example, the processing includes, but not limited to, logical operation, reading/writing, sense amplification, etc. The function module in the example may be determined based on the requirement for a power mapping check.

For example, the power mapping of the memory may be fully detected under the control of the control module. In an example, the device includes a control module, and the control module is configured to control the acquisition module and the detection module to perform detection according to a functional level of each function module. Accordingly, the power supply mapping detection may be performed for each function module at each functional level until the power supply mapping detection is completed for all function modules. In another example, a control module is configured to count all function modules connected to the power apply signal according to the design circuit. Therefore, it is also possible to count all ports connected to the power supply signal according to the design circuit, and determine the corresponding function modules based on the statistics of these ports, and the acquisition module and the detection module perform power supply mapping detection for each function module until the power supply mapping detection is completed for all the function modules.

In an example, the voltage value of the power supply signal may be represented as binary bit data, and the voltage value of the power supply signal may be accurately represented by the binary bit data. For example, the binary bit data may include the first data, the second data, and the third data. The first data indicates a current power supply state, the second data indicates a positive sign or a negative sign of a voltage value of the power supply signal, and the third data indicates a voltage absolute value of the power supply signal. In the present example, the binary bit data is used to represent the voltage value of the power supply signal, such that more information can be carried for checking whether the power connection of each function module is correct, thereby assisting the designer to find the power connection error.

In practical application, based on different types of voltage value representation, a more convenient manner can be considered to perform voltage value matching. As a manner, on the basis of the above example, the standard voltage value can also be represented as binary bit data. Accordingly, the detection module 82 is specifically configured to detect whether each bit data of the voltage value of the power supply signal is same as the respective bit data of the standard voltage value; responsive that each bit data of the voltage value of the power supply signal is same as the respective bit data of the standard voltage value, determine that a voltage value of the power supply signal matches a standard voltage value corresponding to the function module if all bit data are consistent; and otherwise, determine that the voltage value of the power supply signal does not match the standard voltage value corresponding to the function module.

It is to be noted that the above example is only an example, and does not exclude other possible implementations. For example, the order of matching may also be performed bit by bit from the low bit to the high bit, or performed bit by bit in other orders.

In practical application, considering the fluctuation and fault tolerance of the signal, when there is a slight allowable error between the voltage value of the power supply signal and the standard voltage value, it is also determined that the voltage value of the power supply signal matched the standard voltage value. In an example, when the voltage value is represented by using binary bit data, the lower the bit, the smaller the error between the two voltage values if the values are unequal. Therefore, in order to further simplify the matching method, the matching may be only performed for the values of the first predetermined number of bits of the two voltage values, and not performed for the values of the remaining lower bits, so that the power supply mapping detection is performed within the allowable error redundancy range, and the detection efficiency is improved. The predetermined number herein may be set according to the allowable error.

In practical application, the standard voltage value information corresponding to each function module can be established and maintained, such that when the power supply mapping detection is performed, the standard voltage value may be obtained conveniently and accurately to match with the actual power supply voltage value. The standard voltage value includes an operating voltage value domain.

The detection module 82 is specifically configured to detect whether a voltage value of the power supply signal is within the operating voltage value domain of the function module.

The detection module 82 is further configured to determine that the voltage value of the power supply signal matches the standard voltage value corresponding to the function module responsive to the voltage value of the power supply signal being within the operating voltage value domain; and determine that the voltage value of the power supply signal does not match the standard voltage value corresponding to the function module responsive to the voltage value of the power supply signal being not within the operating voltage value domain.

The operating voltage domain may be determined according to the operating voltage of the function module. In an example, the operating voltage domain includes at least one of: a Vwlp value domain, a Vcslp value domain, and a Viso value domain. Specifically, each operating voltage has its own corresponding value domain range, and the value domain range of different voltages may be different.

In the above example, by way of the value domain, the matching result is determined by detecting whether the actual power supply voltage value falls within the operating voltage value domain, such that the voltage fluctuation and error of the circuit in the actual operating scenario can be taken into consideration, thereby improving the accuracy and reliability of the power supply mapping detection.

According to the above example, the difference between different power supplies can be distinguished based on the voltage value of the power supply signal, and the power supply traceability of the function module may be implemented by matching for the voltage values, so that the positioning error correction of the power supply mapping is facilitated, automatic detection is implemented, and the verification efficiency is improved.

In order to improve the reliability of the power supply mapping detection, it is further considered the possibility that the voltage values of some power supply signals are the same. For this case, a further detection method is provided in some embodiments.

On the basis of any one of the foregoing examples, the device further includes an adjusting module.

The adjusting module is configured to, after detecting whether the voltage value of the power supply signal matches the standard voltage value corresponding to the function module, adjust an output voltage of an amplifier corresponding to the function module responsive to the voltage value of the power supply signal matching the standard voltage value corresponding to the function module, wherein the amplifier is configured to output the power supply signal.

The detection module 82 is further configured to: detect whether the power supply signal received by the function module changes with adjustment of the amplifier; responsive to the power supply signal received by the function module changing, determine that the connection error does not occur in the power supply connection of the function module; and responsive to the power supply signal received by the function module not changing, determine that the connection error occurs in the power supply connection of the function module.

In an example, the adjustment module is specifically configured to change the gain coefficient of the amplifier currently corresponding to the function module. In another example, the adjustment module is specifically configured to select another amplifier as the amplifier currently corresponding to the function module. The gain coefficient of the another amplifier is different from the gain coefficient of the amplifier previously corresponding to the function module.

The change with the adjustment of the amplifier indicates that, based on the assumption that the power connection is correct, the adjustment of the amplifier should reflect to the corresponding change in the power supply signal received by the function module. In an example, the detection module 82 is specifically configured to determine that the power supply signal received by the function module changes with the adjustment of the amplifier, responsive to detecting that the power supply signal received by the function module meets at least one of the following conditions: a change in the power supply signal is positively correlated with the adjustment of the amplifier, or the change in the power supply signal lasts for a preset duration.

In some embodiments, further consideration is given to refined power supply scenarios in different operating modes, such as a time-sharing power supply mode or a superimposed power supply mode, and a more targeted power supply mapping detection method is provided. The power supply mapping detection for different power supply modes will be described with reference to the following embodiments.

In some embodiments, the standard voltage value corresponds to an operating mode of the function module. The detection module 82 is specifically configured to determine a current operation mode of the function module. The detection module 82 is further configured to detect whether the voltage value of the power supply signal matches the standard voltage value corresponding to the current operation mode.

In an example, the standard voltage value includes a standard voltage value corresponding to a high frequency mode and a standard voltage value corresponding to a low frequency mode. The detection module 82 is specifically configured to: determine whether the function module is in a time-sharing power supply mode; and responsive to the function module being in the time-sharing power supply mode, determine whether the function module is in the high frequency mode or in the low frequency mode. The detection module 82 is further configured to: when the function module is in the high frequency mode, detect whether the voltage value of the power supply signal matches the standard voltage value corresponding to the high frequency mode. The detection module 82 is further configured to: when the function module is in the low frequency mode, detect whether the voltage value of the power supply signal matches the standard voltage value corresponding to the low frequency mode. Herein the standard voltage value corresponding to the high frequency mode is different from the standard voltage value corresponding to the low frequency mode.

For the power supply mapping detection in the time-sharing power supply mode, in the present example, when the function module is in the time-sharing power supply mode, the corresponding standard voltage value is selected according to whether the function module is currently in the high frequency or in the low frequency mode. Then, the matching is performed between the selected standard voltage value and the voltage value of the power supply signal currently received by the function module.

In another example, the standard voltage value includes a standard voltage value corresponding to the superimposed power supply. The detection module 82 is specifically configured to: if the current operation mode is superimposed power supply, detect whether the voltage value of the power supply signal matches the standard voltage value corresponding to the superimposed power supply.

For the power supply mapping detection in the superimposed power supply mode, in the present example, when the function module is in the superimposed power supply mode, the standard voltage value corresponding to the function module in the superimposed power supply mode is selected. Then, the power mapping of the function module is detected by matching the selected standard voltage value with the voltage value of the power supply signal currently received by the function module.

It is to be noted that the above examples in the embodiment may be implemented individually or in combination.

In the power supply mapping detection device provided in this embodiment, according to the power supply signal actually received by the function module, the detection module checks whether the power supply connection of the function module is correct by detecting whether the voltage value of the power supply signal obtained by the acquisition module matches the standard voltage value designed for the function module. In the above method, by detecting whether the actual power supply voltage value matches the desired standard voltage value, the power supply connection of each function module may be detected, so as to check and correct the wrong connection timely, thereby ensuring reliable implementation of refined power supply and effectively reducing the power consumption.

Third Embodiment

Figure 9:
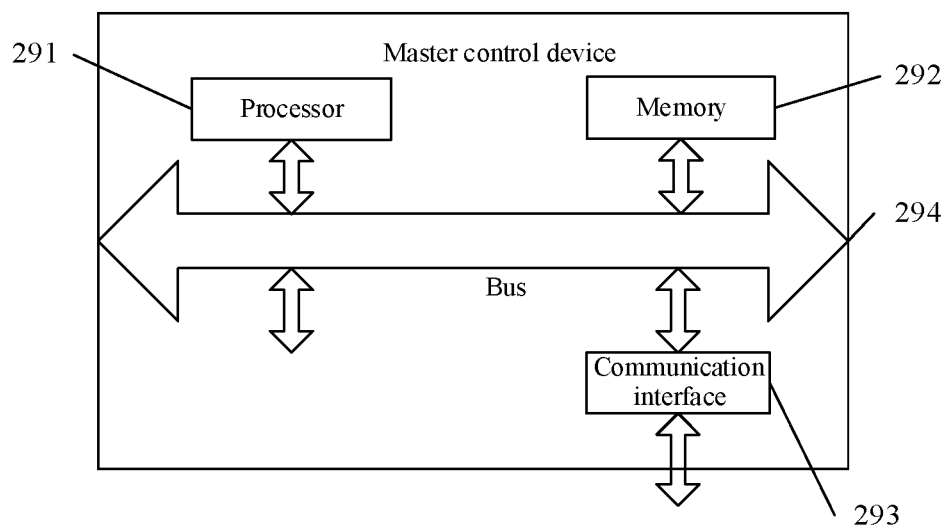
FIG. 9 is a schematic structural diagram of an electronic device provided by a third embodiment of the present disclosure.

FIG. 9 is a schematic structural diagram of an electronic device according to a third embodiment of the present disclosure. As illustrated in FIG. 9, the electronic device includes:

a processor 291, the electronic device further includes a memory 292, and may further includes a communication interface 293 and a bus 294. The processor 291, the memory 292, and the communication interface 293 may communicate with each other through the bus 294. The communication interface 293 may be used for information transmission. The processor 291 may invoke logical instructions in the memory 294 to perform the methods of the embodiments described above.

In addition, the logical instructions in the memory 292 described above may be implemented in the form of software functional unit and may be stored in a computer readable storage medium when sold or used as a separate product.

The memory 292 serves as a computer-readable storage medium for storing software programs, computer-executable programs, program instructions/modules corresponding to the methods as in the embodiments of the present disclosure. The processor 291 executes the functional applications and data processing, i.e., implementing the method in the above-described embodiments, by executing software programs, instructions, and modules stored in the memory 292.

The memory 292 may include a stored program area and a stored data area. The stored program area may store an operating system, an application program required for at least one function. The storage data area may store data created according to the use of the terminal device, etc. In addition, the memory 292 may include a high-speed random access memory, and may further include a non-volatile memory.

In the method and device for power supply mapping detection, electronic device and medium provided in the embodiments of the present disclosure, according to the power supply signal actually received by the function module, it is detected whether the power supply connection of the function module is correct by detecting whether the voltage value of the actually received power supply signal matches the standard voltage value designed for the function module. In the above method, by detecting whether the actual power supply voltage value matches the desired standard voltage value, the power supply connection of each function module may be detected, so as to check and correct the wrong connection timely, thereby ensuring reliable implementation of refined power supply and effectively reducing the power consumption.

In an exemplary embodiment, there is also provided a computer-readable storage medium having stored thereon computer-executable instruction, and the computer-executable instruction is for implementing the method when executed by a processor. For example, the computer-readable storage medium may be ROM, Random Access Memory (RAM), Compact Disc Read-Only Memory (CD-ROM), magnetic tape, floppy disk, optical data storage device, or the like.

Other embodiments of the disclosure will be easily conceived by those skilled in the art after taking the Description into consideration and practicing the solution disclosed herein. The disclosure is intended to cover any variations, uses, or adaptive changes of the disclosure. These variations, uses, or adaptive changes follow the general principles of the disclosure and include common general knowledge or conventional technical means in the art that are not disclosed herein. The Description and the embodiments are to be regarded as being exemplary only. The true scope and spirit of the disclosure are subject to the claims.

It is to be understood that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A method for power supply mapping detection, applied to a memory, wherein the memory comprises a function module, and the method comprises:
    obtaining a voltage value of a power supply signal according to the power supply signal currently received by the function module;
    detecting whether the voltage value of the power supply signal matches a standard voltage value corresponding to the function module; and
    responsive to the voltage value of the power supply signal not matching the standard voltage value corresponding to the function module, determining that a connection error occurs in a power supply connection of the function module.

2. The method of claim 1, wherein the standard voltage value comprises an operating voltage value domain; and detecting whether the voltage value of the power supply signal matches the standard voltage value corresponding to the function module comprises:
    detecting whether the voltage value of the power supply signal is within the operating voltage value domain of the function module; and
    responsive to the voltage value of the power supply signal being within the operating voltage value domain, determining that the voltage value of the power supply signal matches the standard voltage value corresponding to the function module; and responsive to the voltage value of the power supply signal being not within the operating voltage value domain, determining that the voltage value of the power supply signal does not match the standard voltage value corresponding to the function module.

3. The method of claim 2, wherein the operating voltage domain comprises at least one of: a word line programming voltage domain, a Voltage of Column Select Line Pump (Vcslp) value domain, or a Voltage of Isolate Gate in Noise Cancelation Sense Amplifier (Viso) value domain.

4. The method of claim 1, wherein after detecting whether the voltage value of the power supply signal matches the standard voltage value corresponding to the function module, the method further comprises:
    responsive to the voltage value of the power supply signal matching the standard voltage value corresponding to the function module, adjusting an output voltage of an amplifier corresponding to the function module, wherein the amplifier is configured to output the power supply signal;
    detecting whether the power supply signal received by the function module changes with adjustment of the amplifier; and
    responsive to the power supply signal received by the function module changing, determining that the connection error does not occur in the power supply connection of the function module; and responsive to the power supply signal received by the function module not changing, determining that the connection error occurs in the power supply connection of the function module.

5. The method of claim 4, wherein adjusting the output voltage of the amplifier corresponding to the function module comprises:
    changing a gain coefficient of an amplifier currently corresponding to the function module; or
    selecting another amplifier as an amplifier currently corresponding to the function module; wherein a gain coefficient of the another amplifier is different from a gain coefficient of an amplifier previously corresponding to the function module.

6. The method of claim 4, wherein detecting whether the power supply signal received by the function module changes with the adjustment of the amplifier comprises:
    determining that the power supply signal received by the function module changes with the adjustment of the amplifier, responsive to detecting that the power supply signal received by the function module meets at least one of following conditions: a change in the power supply signal is positively correlated with the adjustment of the amplifier, or the change in the power supply signal lasts for a preset duration.

7. The method of claim 1, wherein the standard voltage value corresponds to an operation mode of the function module; and detecting whether the voltage value of the power supply signal matches the standard voltage value corresponding to the function module comprises:
    determining a current operation mode of the function module; and
    detecting whether the voltage value of the power supply signal matches the standard voltage value corresponding to the current operation mode.

8. The method of claim 7, wherein the standard voltage value comprises a standard voltage value corresponding to a high frequency mode and a standard voltage value corresponding to a low frequency mode; and determining the current operation mode of the function module comprises:
    determining whether the function module is in a time-sharing power supply mode; responsive to the function module being in the time-sharing power supply mode, determining whether the function module is in the high frequency mode or in the low frequency mode; and
    detecting whether the voltage value of the power supply signal matches the standard voltage value corresponding to the current operation mode comprises:
    when the function module is in the high frequency mode, detecting whether the voltage value of the power supply signal matches the standard voltage value corresponding to the high frequency mode; and when the function module is in the low frequency mode, detecting whether the voltage value of the power supply signal matches the standard voltage value corresponding to the low frequency mode; wherein the standard voltage value corresponding to the high frequency mode is different from the standard voltage value corresponding to the low frequency mode.

9. The method of claim 7, wherein the standard voltage value comprises a standard voltage value corresponding to a superimposed power supply; and detecting whether the voltage value of the power supply signal matches the standard voltage value corresponding to the current operation mode comprises:
when the current operation mode is the superimposed power supply, detecting whether the voltage value of the power supply signal matches the standard voltage value corresponding to the superimposed power supply.

10. The method of claim 1, wherein the voltage value of the power supply signal is represented as binary bit data; and the binary bit data comprises first data, second data, and third data; and
wherein the first data indicates a current power supply state, the second data indicates the voltage value of the power supply signal has a positive sign or a negative sign, and the third data indicates a voltage absolute value of the power supply signal.

11. The method of claim 10, wherein the standard voltage value is represented as binary bit data; and detecting whether the voltage value of the power supply signal matches the standard voltage value corresponding to the function module comprises:
detecting whether each bit data of the voltage value of the power supply signal is the same as a respective bit data of the standard voltage value; and
responsive to each bit data of the voltage value of the power supply signal being the same as the respective bit data of the standard voltage value, determining that the voltage value of the power supply signal matches the standard voltage value corresponding to the function module; and responsive to each bit data of the voltage value of the power supply signal being not the same as the respective bit data of the standard voltage value, determining that the voltage value of the power supply signal does not match the standard voltage value corresponding to the function module.

12. A device for power supply mapping detection, comprising: a processor and a memory communicatively connected to the processor;
wherein the memory is configured to store computer-executable instructions; and
the processor is configured to execute the computer-executable instructions stored in the memory to:
obtain a voltage value of a power supply signal according to the power supply signal currently received by a function module;
detect whether the voltage value of the power supply signal matches a standard voltage value corresponding to the function module; and
responsive to the voltage value of the power supply signal not matching the standard voltage value corresponding to the function module, determine that a connection error occurs in a power supply connection of the function module.

13. The device of claim 12, wherein the standard voltage value comprises an operating voltage value domain;
the detection module is further configured to detect whether the voltage value of the power supply signal is within the operating voltage value domain of the function module; and
the processor is further configured to execute the computer-executable instructions stored in the memory to: determine that the voltage value of the power supply signal matches the standard voltage value corresponding to the function module responsive to the voltage value of the power supply signal being within the operating voltage value domain; and determine that the voltage value of the power supply signal does not match the standard voltage value corresponding to the function module responsive to the voltage value of the power supply signal being not within the operating voltage value domain.

14. The device of claim 12, wherein the processor is further configured to execute the computer-executable instructions stored in the memory to:
after detecting whether the voltage value of the power supply signal matches the standard voltage value corresponding to the function module, adjust an output voltage of an amplifier corresponding to the function module responsive to the voltage value of the power supply signal matching the standard voltage value corresponding to the function module, wherein the amplifier is configured to output the power supply signal; and
detect whether the power supply signal received by the function module changes with adjustment of the amplifier; responsive to the power supply signal received by the function module changing, determine that the connection error does not occur in the power supply connection of the function module; and responsive to the power supply signal received by the function module not changing, determine that the connection error occurs in the power supply connection of the function module.

15. The device of claim 12, wherein the standard voltage value corresponds to an operation mode of the function module;
the processor is further configured to execute the computer-executable instructions stored in the memory to:
determine a current operation mode of the function module; and
detect whether the voltage value of the power supply signal matches the standard voltage value corresponding to the current operation mode.

16. The device of claim 15, wherein the standard voltage value comprises a standard voltage value corresponding to a high frequency mode and a standard voltage value corresponding to a low frequency mode;
the processor is further configured to execute the computer-executable instructions stored in the memory to:
determine whether the function module is in a time-sharing power supply mode; and responsive to the function module being in the time-sharing power supply mode, determine whether the function module is in the high frequency mode or in the low frequency mode;
when the function module is in the high frequency mode, detect whether the voltage value of the power supply signal matches the standard voltage value corresponding to the high frequency mode; and
when the function module is in the low frequency mode, detect whether the voltage value of the power supply signal matches the standard voltage value corresponding to the low frequency mode; wherein the standard voltage value corresponding to the high frequency mode is different from the standard voltage value corresponding to the low frequency mode.

17. The device of claim 15, wherein the standard voltage value comprises a standard voltage value corresponding to a superimposed power supply; and
the processor is further configured to execute the computer-executable instructions stored in the memory to:
when the current operation mode is the superimposed power supply, detecting whether the voltage value of the power supply signal matches the standard voltage value corresponding to the superimposed power supply.

18. A non-transitory computer-readable storage medium having stored thereon computer-executable instructions that when executed by a processor, implement a method, the method comprising:
obtaining a voltage value of a power supply signal according to the power supply signal currently received by a function module;
detecting whether the voltage value of the power supply signal matches a standard voltage value corresponding to the function module; and
responsive to the voltage value of the power supply signal not matching the standard voltage value corresponding to the function module, determining that a connection error occurs in a power supply connection of the function module.

19. The non-transitory storage medium of claim 18, wherein the standard voltage value comprises an operating voltage value domain; and detecting whether the voltage value of the power supply signal matches the standard voltage value corresponding to the function module comprises:
detecting whether the voltage value of the power supply signal is within the operating voltage value domain of the function module; and
responsive to the voltage value of the power supply signal being within the operating voltage value domain, determining that the voltage value of the power supply signal matches the standard voltage value corresponding to the function module; and responsive to the voltage value of the power supply signal being not within the operating voltage value domain, determining that the voltage value of the power supply signal does not match the standard voltage value corresponding to the function module.

20. The non-transitory storage medium of claim 19, wherein the operating voltage domain comprises at least one of: a word line programming voltage domain, a Voltage of Column Select Line Pump (Vcslp) value domain, or a Voltage of Isolate Gate in Noise Cancelation Sense Amplifier (Viso) value domain.

* * * * *